United States Patent [19]
Felten

[11] 4,070,200
[45] Jan. 24, 1978

[54] COMPOSITIONS CONTAINING DIETHYLENE GLYCOL ETHER

[75] Inventor: John James Felten, Lewiston, N.Y.

[73] Assignee: E. I. Du Pont de Nemours and Company, Wilmington, Del.

[21] Appl. No.: 675,764

[22] Filed: Apr. 12, 1976

[51] Int. Cl.² ............................................. C08L 1/28
[52] U.S. Cl. .................................. 106/175; 106/1.05; 106/188; 106/189; 106/193 R; 106/193 M
[58] Field of Search ................... 106/1, 174, 175, 188, 106/189, 193 R, 193 M; 252/512, 514

[56] References Cited

U.S. PATENT DOCUMENTS

| | | | |
|---|---|---|---|
| 3,290,171 | 12/1966 | Zollman et al. | 106/1 |
| 3,536,508 | 10/1970 | Short | 106/173 |
| 3,537,888 | 11/1970 | Schwyn | 106/1 |
| 3,830,651 | 8/1974 | Minneman et al. | 106/1 |

Primary Examiner—Lorenzo B. Hayes

[57] ABSTRACT

In electronic compositions of inorganic powders dispersed in vehicles of solvent and polymer, said compositions being useful for printing inorganic powders on dielectric substrates, followed by firing to produce various electronic functions, improved vehicles wherein the solvent comprises dibutyl carbitol and another, more volatile, solvent.

10 Claims, 2 Drawing Figures

COMPOSITIONS CONTAINING DIETHYLENE GLYCOL ETHER

BACKGROUND OF THE INVENTION

This invention relates to electronic compositions, and more particularly to compositions comprising novel vehicles.

The use of a volatile organic liquid viscosified by a polymeric component dissolved therein as a medium or vehicle for dispersing finely divided inorganic powders (e.g., less than 200 mesh, standard U.S. sieve scale) and then printing the dispersion on dielectric substrates, is well known in the electronics art. The printed substrate is then heated or fired to first remove the vehicle from the printed pattern and then sinter or cure the inorganic powders into the desired function (e.g., resistors, conductors, dielectrics, varistors, etc.) adherent to the substrate. Materials and their propertions, as well as printing and firing techniques and conditions, are well known to those skilled in the electronics art. Typical of the vehicles employed are those of Short U.S. Pat. No. 3,536,508, issued Oct. 27, 1970, and incorporated by reference herein. Vehicles comprising solvents such as terpineol or butyl carbitol ($C_4H_9OCH_2CH_2OH$) have been commercially available for several years, but improved vehicles are required.

There has developed a need for vehicles which are characterized by decreased sensitivity of viscosity to variations in ambient temperature, so that dispersions or inorganic materials in such vehicles exhibit such decreased sensitivity of viscosity. Decreased sensitivity to temperature would lead to more reproducible print thickness and hence more reproducible electronic functions (e.g., resistors). Furthermore, after the dispersion has been printed on a substrate in the desired pattern and before it is fired, the ambient temperature may change and/or the printed substrate may be exposed to variations in temperature as it proceeds from one work station to another prior to firing. Especially desired would be a vehicle system which is capable of forming dispersions which exhibit less than a 40% change in viscosity when the temperature is changed from 20° to 30° C.

Also needed are vehicles which are less hygroscopic than conventional vehicles, and also tend to be less reactive with the inorganic solids.

SUMMARY OF THE INVENTION

Dispersions of finely divided inorganic powders in a vehicle are useful for printing patterns on dielectric substrates, followed by firing to produce electronic functions. The vehicle usually comprises polymer(s) as viscosifiers and volatile organic liquid(s) as solvents for the polymer. I have invented improved dispersions wherein the sensitivity of the viscosity of the composition (dispersion) to changes in ambient temperature (20°-30° C.) is reduced.

The vehicle in my compositions is characterized by a mixture of volatile organic liquids, one of which is dibutyl carbitol (DBC), plus at least one other liquid having a boiling point about 10° C. (or more) lower than that of DBC.

The solvent in the vehicle preferably comprises 5-80% DBC, preferably 10-15% DBC, and a complemental amount of more volatile solvent.

The vehicle preferably comprises complementally 5-15% polymer and 95-85% solvent mixture, more preferably 7-13% polymer and 93-87% solvent mixture.

The preferred DBC is the n-butyl isomer. The preferred more volatile solvent is terpineol. The preferred polymer is ethyl cellulose.

BRIEF REFERENCE TO THE DRAWING

In the drawing,

FIG. 1 shows the reduced temperature dependence on viscosity of resistor and conductor compositions of this invention (1A and 2A) as compared with the behavior of prior art compositions (1B and 2B).

FIG. 2 compares the performance of a dielectric composition of the invention (3A) and that of the prior art (3B).

DETAILED DESCRIPTION OF THE INVENTION

Figure 2:
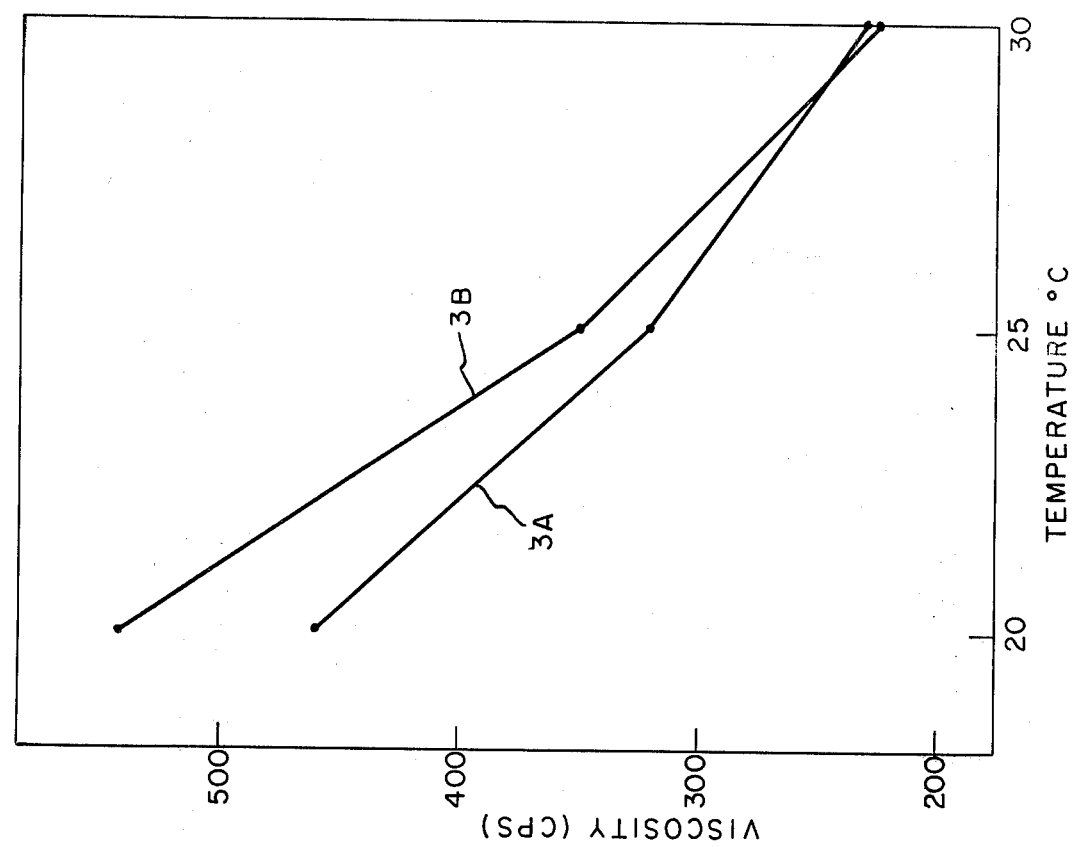

The resultant electrical properties of a fired electronic pattern can be affected by the nature of the vehicle used to disperse the desired inorganic particulate prior to printing. The present invention can produce more reliable electronic functions since the rate of drying of the vehicle is slower, the dispersion releases from the screen during printing in a cleaner fashion, and, most importantly, the viscosity of the dispersion is less sensitive to changes in ambient temperature.

Using conventional dispersing, printing and firing techniques well known to those skilled in the art, I have invented improved vehicles characterized by the presence in the vehicle of dibutyl carbitol, $(C_4H_9OCH_2CH_2)_2O$, sometimes referred to therein as DBC. Various isomers of DBC may be used but the n-butyl isomer is preferred. This may also be described as diethylene glycol dibutyl ether or bis-$\beta$-butoxyethyl ether. DBC is relatively nonhygroscopic and is of reduced reactivity with inorganic solids, perhaps due to the absence of groups such as acid groups, unsaturated bonds, etc.

DBC is one of the two solvents (volatile organic liquids) in the vehicle of the present invention. The other solvent is more volatile than is DBC, having a boiling point at atmospheric pressure at least about 10° C. below that of DBC (256° C. for the n-butyl isomer). Where other isomers of DBC or mixtures thereof are used, the second solvent (other than DBC) should have a boiling point at least 10° C. lower than that of the DBC isomer(s) used. Terpineol is the preferred second solvent, while benzyl alcohol and linalool and the like may be used.

DBC is not used alone as the sole solvent in the vehicle due to its relatively high boiling point and since DBC/ethyl cellulose solutions tend to gel significantly. Further, great lot-to-lot variations in the vehicle occur, leading to nonreproducible printing properties.

The relative amounts of DBC and the second solvent, and the relative amount of solvents versus polymer, are matters of choice dependent upon the desired printing properties. Generally, the solvent itself (volatile organic liquid) comprises 5-80% DBC, preferably 10-50% DBC. The vehicle generally comprises 5-15% polymer and 95-15% solvents, preferably 7-13% polymer and 93-87% solvents.

The polymer is again a matter of choice, so long as it is soluble in the solvents. Polymers such as ethyl cellulose, ethylhydroxyethyl cellulose, and any other compatible polymer may be used. Ethyl cellulose is preferred, as is the DBC/terpineol/ethyl cellulose system.

Adjuvants may be added to aid dispersion of the solids in the vehicle and the properties of the resultant dispersion, such as conventional thixotropes, wetting agents, etc.

EXAMPLES

In these examples and elsewhere in the specification and claims, all parts, percentages, ratios, etc. are by weight, unless otherwise stated. The n-butyl isomer of DBC was used in the Examples below. The thixotrope used was hydrogenated caster oil in a hydrocarbon carrier. The inorganic powders used had average particle sizes in the range of 0.5–5 microns.

EXAMPLE 1

A resistor composition (1-A) was prepared by blending together in a roll mill the following finely divided solids and vehicle constituents in parts by weight: $Bi_2Ru_2O_7$, 14.65; glass and modifiers, 54.35; terpineol, 15.67; dibutyl carbitol, 11.68; ethyl cellulose, 2.15; thixotrope, 1.0; and soya lecithin wetting agent, 0.5. The solvent ratio was 42.7% DBC/57.3% terpineol. The vehicle contained 7.4% polymer and 92.6 solvent. The composition had a viscosity of 120–170 cps between 20° and 30° C. as measured on a Brookfield HAT instrument, using a utility cap and spindle, set at 10 rpm (4 sec.$^{-1}$) shear rate. The composition was printed on prefired alumina substrates using a 325 mesh screen; the print was dried at 100° C. for 15 min. to a thickness of 24–26 microns and fired to produce a 16-micron thick resistor having resistivity of 583,000 ohms/square. The properties were quite reproducible. The viscosity (see curve 1A of FIG. 1) had reduced sensitivity to changes in temperature.

A comparative experiment (1B) was run using another resistor composition which contained an ethyl cellulose/terpineol vehicle, not of the present invention. The composition contained, in parts by weight, $Bi_2Ru_2O_7$, 14.1; glass and modifiers, 52.3; terpineol, 30.2; ethyl cellulose, 2.9; soya lecithin wetting agent, 0.5. The viscosity/temperature behavior of this dispersion is set forth as curve 1B of FIG. 1. The viscosity of composition 1B was affected by temperature change considerably more than was that of composition 1A of this invention.

EXAMPLE 2

Figure 1:
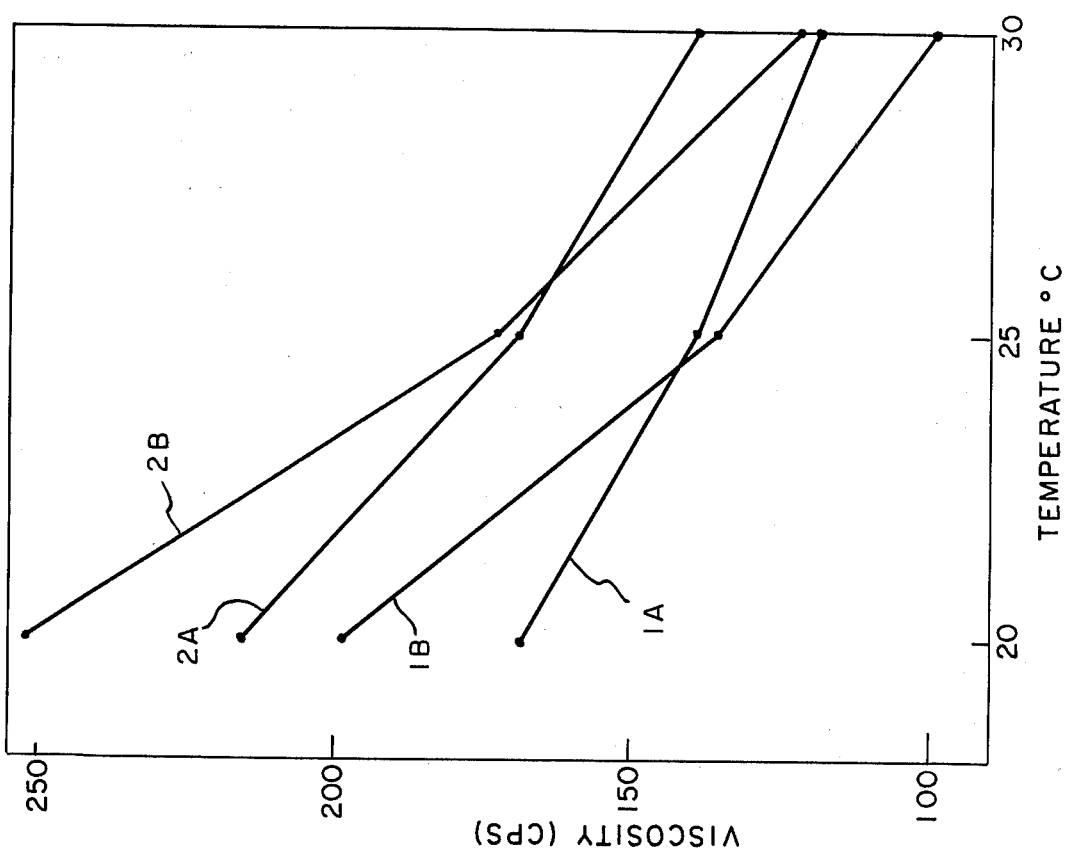

A palladium/silver conductor paste (2A) was prepared with a vehicle comprising DBC. It contained, in parts by weight: Pd, 18.0; Ag, 45.0; glass powder, 16.0; thixotrope 1.2; ethyl cellulose, 2.2; terpineol, 8.4; DBC, 9.2. The solvent contained 53% DBC and 47% terpineol. The vehicle contained 11.1% polymer and 88.9% solvent. Release of the composition from the printing screen was good. Viscosity/temperature sensitivity is reduced as seen in FIG. 1.

A conductor composition 2B was examined; it was identical to composition 2A except that the vehicle contained no DBC, but was (in parts by wt). thixotropic, 2.0; ethyl cellulose, 1.8; and terpineol, 17.2. Screen release of this material is inferior to that of 2A, as was temperature/viscosity behavior (see FIG. 1).

EXAMPLE 3

A dielectric composition 3A was prepared, using a DBC solvent system, from the following components, in parts by weight: glass and modifiers, 72.9; dyes and pigments, 2.5; soya lecithin wetting agent, 1.0; ethyl cellulose, 2.4; DBC, 11.1; terpineol, 11.1. The solvent contained 50% DBC and 50% terpineol. The vehicle contained 9.8% polymer and 90.2% solvent. See FIG. 2 for viscosity/temperature performance.

A second dielectric composition 3B was prepared using the same glass and modifiers, dyes and pigments, but using a different vehicle having no DBC. The vehicle was, in parts by wt. soya lecithin, 1.0; ethyl cellulose, 2.2; terpineol, 21.4. The viscosity of 3B was more sensitive to change in temperature than was that of 3A (which contained DBC). Furthermore, 3A printed twice as fast as did 3B, 3A having excellent screen release characteristics.

I claim:

1. In a composition for printing electronic functions on a substrate comprising finely divided inorganic powders dispersed in a vehicle containing a volatile organic liquid and polymer viscosifiers, the improvement comprising, as the volatile organic liquid, a mixture of 5–80% by weight of said liquid of diethylene glycol dibutyl ether, and the remainder being a second more volatile organic liquid having a boiling point at least about 10° C. less than that of said ether diethylene glycol dibutyl ether.

2. Compositions according to claim 1 wherein the volatile organic liquid comprises 10–50% diethylene glycol dibutyl ether.

3. Compositions according to claim 1 wherein the organic liquid comprises diethylene glycol dibutyl ether and terpineol.

4. Compositions according to claim 2 wherein the organic liquid comprises diethylene glycol dibutyl ether and terpineol.

5. Compositions according to claim 1 comprising, by weight and complementally, 5–15% polymer and 95–85% volatile organic liquid.

6. Compositions according to claim 2 comprising, by weight and complementally, 5–15% polymer and 95–85% volatile organic liquid.

7. Compositions according to claim 3 comprising, by weight and complementally, 5–15% polymer and 95–85% volatile organic liquid.

8. Compositions according to claim 5 wherein the polymer is ethyl cellulose, and the amount of ethyl cellulose is 7–13% of the vehicle.

9. Compositions according to claim 6 wherein the polymer is ethyl cellulose, and the amount of ethyl cellulose is 7–13% of the vehicle.

10. Compositions according to claim 7 wherein the polymer is ethyl cellulose, and the amount of ethyl cellulose is 7–13% of the vehicle.

* * * * *